US010079269B2

United States Patent
Chaji et al.

(10) Patent No.: US 10,079,269 B2
(45) Date of Patent: Sep. 18, 2018

(54) MULTI-FUNCTIONAL ACTIVE MATRIX ORGANIC LIGHT-EMITTING DIODE DISPLAY

(71) Applicant: Ignis Innovation Inc., Waterloo (CA)

(72) Inventors: Gholamreza Chaji, Waterloo (CA); Baolin Tian, Kitchener (CA)

(73) Assignee: Ignis Innovation Inc., Waterloo (CA)

( * ) Notice: Subject to any disclaimer, the term of this patent is extended or adjusted under 35 U.S.C. 154(b) by 0 days.

(21) Appl. No.: 15/783,662

(22) Filed: Oct. 13, 2017

(65) Prior Publication Data

US 2018/0053814 A1    Feb. 22, 2018

Related U.S. Application Data

(63) Continuation of application No. 15/174,174, filed on Jun. 6, 2016, now Pat. No. 9,818,806, which is a
(Continued)

(51) Int. Cl.
*H01L 27/32* (2006.01)
*G06F 3/042* (2006.01)
(Continued)

(52) U.S. Cl.
CPC .......... *H01L 27/3227* (2013.01); *G06F 3/042* (2013.01); *G06F 3/0412* (2013.01);
(Continued)

(58) Field of Classification Search
CPC ............. H01L 27/3209; H01L 27/3227; H01L 27/323; H01L 31/022425; H01L 31/04;
(Continued)

(56) References Cited

U.S. PATENT DOCUMENTS 4,354,162 A    10/1982  Wright
4,758,831 A     7/1988  Kasahara et al.
(Continued)

FOREIGN PATENT DOCUMENTS

CA    1294034     1/1992
CA    2109951    11/1992
(Continued)

OTHER PUBLICATIONS

Ahnood et al.: "Effect of threshold voltage instability on field effect mobility in thin film transistors deduced from constant current measurements"; dated Aug. 2009 (3 pages).
(Continued)

*Primary Examiner* — Amare Mengistu
*Assistant Examiner* — Gloryvid Figueroa-Gibson
(74) *Attorney, Agent, or Firm* — Nixon Peabody LLP

(57) ABSTRACT

A multi-functional active matrix display comprises a transparent front sheet, a semi-transparent layer of light emissive devices adjacent the rear side of the front sheet and forming a matrix of display pixels, and a solar cell layer located behind the light emissive devices for converting both ambient light and internal light7 from the light emissive devices into electrical energy, the solar cell layer including an array of electrodes on the front surface of the solar cell layer for use in detecting the location of a change in the amount of light impinging on a portion of the front surface of the solar cell layer.

15 Claims, 3 Drawing Sheets

Related U.S. Application Data continuation of application No. 13/689,241, filed on Nov. 29, 2012, now Pat. No. 9,385,169.

(60) Provisional application No. 61/564,634, filed on Nov. 29, 2011.

(51) Int. Cl.
| | |
|---|---|
| *H01L 51/52* | (2006.01) |
| *G09G 3/3225* | (2016.01) |
| *H01L 27/28* | (2006.01) |
| *G09G 3/00* | (2006.01) |
| *G09G 3/34* | (2006.01) |
| *G06F 3/041* | (2006.01) |
| *H01L 51/50* | (2006.01) |
| *H01L 51/00* | (2006.01) |

(52) U.S. Cl.
CPC ........... *G06F 3/0421* (2013.01); *G09G 3/003* (2013.01); *G09G 3/3225* (2013.01); *G09G 3/3406* (2013.01); *H01L 27/288* (2013.01); *H01L 27/323* (2013.01); *H01L 51/525* (2013.01); *H01L 51/5206* (2013.01); *H01L 51/5234* (2013.01); *H01L 51/5246* (2013.01); *H01L 51/5284* (2013.01); *G09G 2354/00* (2013.01); *G09G 2358/00* (2013.01); *H01L 51/006* (2013.01); *H01L 51/0058* (2013.01); *H01L 51/0071* (2013.01); *H01L 51/0072* (2013.01); *H01L 51/0081* (2013.01); *H01L 51/5012* (2013.01); *H01L 51/5056* (2013.01); *H01L 51/5072* (2013.01); *H01L 51/5092* (2013.01); *H01L 51/524* (2013.01); *H01L 2251/301* (2013.01); *H01L 2251/305* (2013.01); *H01L 2251/308* (2013.01); *H01L 2251/5323* (2013.01); *H01L 2251/558* (2013.01)

(58) Field of Classification Search
CPC ............... H01L 27/288; H01L 51/5206; H01L 51/5234; H01L 51/5246; H01L 51/525; H01L 51/5284; H01L 2251/301; H01L 2251/305; H01L 2251/308; H01L 2251/5323; H01L 2251/558; H01L 51/0058; H01L 51/006; H01L 51/0071; H01L 51/0072; H01L 51/0081; H01L 51/5012; H01L 51/5056; H01L 51/5072; H01L 51/5092; H01L 51/524; F21Y 2101/02; F21Y 2105/00; G02F 2001/133618; G09F 13/22; G09F 27/007; G09F 9/33; G06F 3/0421; G06F 3/042; G06F 2203/04104; G06F 1/3203; G06F 1/3262; G06F 2203/04103; G06F 3/0412; G09G 3/3225; G09G 2300/0866; G09G 2330/021; G09G 2360/144; G09G 2360/148; G09G 3/003; G09G 3/3406; G09G 2354/00; G09G 2358/00; H05B 33/14; H04N 5/30; H04N 5/374; H04N 5/2251; A61B 1/0684; A61B 5/06
USPC ........ 345/39–46, 82, 173–178; 257/84, 642; 178/18.01, 18.09, 18.11
See application file for complete search history.

(56) References Cited

U.S. PATENT DOCUMENTS

| | | |
|---|---|---|
| 4,963,860 A | 10/1990 | Stewart |
| 4,975,691 A | 12/1990 | Lee |
| 4,996,523 A | 2/1991 | Bell et al. |
| 5,051,739 A | 9/1991 | Hayashida et al. |
| 5,222,082 A | 6/1993 | Plus |
| 5,266,515 A | 11/1993 | Robb et al. |
| 5,498,880 A | 3/1996 | Lee et al. |
| 5,589,847 A | 12/1996 | Lewis |
| 5,619,033 A | 4/1997 | Weisfield |
| 5,648,276 A | 7/1997 | Hara et al. |
| 5,670,973 A | 9/1997 | Bassetti et al. |
| 5,684,365 A | 11/1997 | Tang et al. |
| 5,686,935 A | 11/1997 | Weisbrod |
| 5,712,653 A | 1/1998 | Katoh et al. |
| 5,714,968 A | 2/1998 | Ikeda |
| 5,747,928 A | 5/1998 | Shanks et al. |
| 5,748,160 A | 5/1998 | Shieh et al. |
| 5,784,042 A | 7/1998 | Ono et al. |
| 5,790,234 A | 8/1998 | Matsuyama |
| 5,815,303 A | 9/1998 | Berlin |
| 5,870,071 A | 2/1999 | Kawahata |
| 5,874,803 A | 2/1999 | Garbuzov et al. |
| 5,880,582 A | 3/1999 | Sawada |
| 5,903,248 A | 5/1999 | Irwin |
| 5,917,280 A | 6/1999 | Burrows et al. |
| 5,923,794 A | 7/1999 | McGrath et al. |
| 5,952,789 A | 9/1999 | Stewart et al. |
| 5,990,629 A | 11/1999 | Yamada et al. |
| 6,023,259 A | 2/2000 | Howard et al. |
| 6,069,365 A | 5/2000 | Chow et al. |
| 6,081,131 A | 6/2000 | Ishii |
| 6,091,203 A | 7/2000 | Kawashima et al. |
| 6,097,360 A | 8/2000 | Holloman |
| 6,144,222 A | 11/2000 | Ho |
| 6,157,583 A | 12/2000 | Starnes et al. |
| 6,166,489 A | 12/2000 | Thompson et al. |
| 6,177,915 B1 | 1/2001 | Beeteson et al. |
| 6,225,846 B1 | 5/2001 | Wada et al. |
| 6,229,508 B1 | 5/2001 | Kane |
| 6,232,939 B1 | 5/2001 | Saito et al. |
| 6,246,180 B1 | 6/2001 | Nishigaki |
| 6,252,248 B1 | 6/2001 | Sano et al. |
| 6,259,424 B1 | 7/2001 | Kurogane |
| 6,274,887 B1 | 8/2001 | Yamazaki et al. |
| 6,288,696 B1 | 9/2001 | Holloman |
| 6,300,928 B1 | 10/2001 | Kim |
| 6,303,963 B1 | 10/2001 | Ohtani et al. |
| 6,306,694 B1 | 10/2001 | Yamazaki et al. |
| 6,307,322 B1 | 10/2001 | Dawson et al. |
| 6,316,786 B1 | 11/2001 | Mueller et al. |
| 6,320,325 B1 | 11/2001 | Cok et al. |
| 6,323,631 B1 | 11/2001 | Juang |
| 6,323,832 B1 | 11/2001 | Nishizawa et al. |
| 6,345,085 B1 | 2/2002 | Yeo et al. |
| 6,348,835 B1 | 2/2002 | Sato et al. |
| 6,365,917 B1 | 4/2002 | Yamazaki |
| 6,373,453 B1 | 4/2002 | Yudasaka |
| 6,384,427 B1 | 5/2002 | Yamazaki et al. |
| 6,392,617 B1 | 5/2002 | Gleason |
| 6,399,988 B1 | 6/2002 | Yamazaki |
| 6,414,661 B1 | 7/2002 | Shen et al. |
| 6,420,758 B1 | 7/2002 | Nakajima |
| 6,420,834 B2 | 7/2002 | Yamazaki et al. |
| 6,420,988 B1 | 7/2002 | Azami et al. |
| 6,433,488 B1 | 8/2002 | Bu |
| 6,445,376 B2 | 9/2002 | Parrish |
| 6,468,638 B2 | 10/2002 | Jacobsen et al. |
| 6,489,952 B1 | 12/2002 | Tanaka et al. |
| 6,501,098 B2 | 12/2002 | Yamazaki |
| 6,501,466 B1 | 12/2002 | Yamagashi et al. |
| 6,512,271 B1 | 1/2003 | Yamazaki et al. |
| 6,518,594 B1 | 2/2003 | Nakajima et al. |
| 6,524,895 B2 | 2/2003 | Yamazaki et al. |
| 6,531,713 B1 | 3/2003 | Yamazaki |
| 6,559,594 B2 | 5/2003 | Fukunaga et al. |
| 6,573,195 B1 | 6/2003 | Yamazaki et al. |
| 6,573,584 B1 | 6/2003 | Nagakari et al. |
| 6,576,926 B1 | 6/2003 | Yamazaki et al. |
| 6,577,302 B2 | 6/2003 | Hunter |
| 6,580,408 B1 | 6/2003 | Bae et al. |
| 6,580,657 B2 | 6/2003 | Sanford et al. |

(56) References Cited

U.S. PATENT DOCUMENTS

| | | |
|---|---|---|
| 6,583,775 B1 | 6/2003 | Sekiya et al. |
| 6,583,776 B2 | 6/2003 | Yamazaki et al. |
| 6,587,086 B1 | 7/2003 | Koyama |
| 6,593,691 B2 | 7/2003 | Nishi et al. |
| 6,594,606 B2 | 7/2003 | Everitt |
| 6,597,203 B2 | 7/2003 | Forbes |
| 6,611,108 B2 | 8/2003 | Kimura |
| 6,617,644 B1 | 9/2003 | Yamazaki et al. |
| 6,618,030 B2 | 9/2003 | Kane et al. |
| 6,641,933 B1 | 11/2003 | Yamazaki et al. |
| 6,661,180 B2 | 12/2003 | Koyama |
| 6,661,397 B2 | 12/2003 | Mikami et al. |
| 6,670,637 B2 | 12/2003 | Yamazaki et al. |
| 6,677,713 B1 | 1/2004 | Sung |
| 6,680,577 B1 | 1/2004 | Inukai et al. |
| 6,687,266 B1 | 2/2004 | Ma et al. |
| 6,690,344 B1 | 2/2004 | Takeuchi et al. |
| 6,693,388 B2 | 2/2004 | Oomura |
| 6,693,610 B2 | 2/2004 | Shannon et al. |
| 6,697,057 B2 | 2/2004 | Koyama et al. |
| 6,720,942 B2 | 4/2004 | Lee et al. |
| 6,734,636 B2 | 5/2004 | Sanford et al. |
| 6,738,034 B2 | 5/2004 | Kaneko et al. |
| 6,738,035 B1 | 5/2004 | Fan |
| 6,771,028 B1 | 8/2004 | Winters |
| 6,777,712 B2 | 8/2004 | Sanford et al. |
| 6,780,687 B2 | 8/2004 | Nakajima et al. |
| 6,806,638 B2 | 10/2004 | Lih et al. |
| 6,806,857 B2 | 10/2004 | Sempel et al. |
| 6,809,706 B2 | 10/2004 | Shimoda |
| 6,859,193 B2 | 2/2005 | Yumoto |
| 6,861,670 B1 | 3/2005 | Ohtani et al. |
| 6,873,117 B2 | 3/2005 | Ishizuka |
| 6,873,320 B2 | 3/2005 | Nakamura |
| 6,878,968 B1 | 4/2005 | Ohnuma |
| 6,909,114 B1 | 6/2005 | Yamazaki |
| 6,909,419 B2 | 6/2005 | Zavracky et al. |
| 6,919,871 B2 | 7/2005 | Kwon |
| 6,937,215 B2 | 8/2005 | Lo |
| 6,940,214 B1 | 9/2005 | Komiya et al. |
| 6,943,500 B2 | 9/2005 | LeChevalier |
| 6,954,194 B2 | 10/2005 | Matsumoto et al. |
| 6,956,547 B2 | 10/2005 | Bae et al. |
| 6,995,510 B2 | 2/2006 | Murakami et al. |
| 6,995,519 B2 | 2/2006 | Arnold et al. |
| 7,022,556 B1 | 4/2006 | Adachi |
| 7,023,408 B2 | 4/2006 | Chen et al. |
| 7,027,015 B2 | 4/2006 | Booth, Jr. et al. |
| 7,034,793 B2 | 4/2006 | Sekiya et al. |
| 7,088,051 B1 | 8/2006 | Cok |
| 7,106,285 B2 | 9/2006 | Naugler |
| 7,116,058 B2 | 10/2006 | Lo et al. |
| 7,129,914 B2 | 10/2006 | Knapp et al. |
| 7,129,917 B2 | 10/2006 | Yamazaki et al. |
| 7,141,821 B1 | 11/2006 | Yamazaki et al. |
| 7,161,566 B2 | 1/2007 | Cok et al. |
| 7,193,589 B2 | 3/2007 | Yoshida et al. |
| 7,199,516 B2 | 4/2007 | Seo et al. |
| 7,220,997 B2 | 5/2007 | Nakata |
| 7,235,810 B1 | 6/2007 | Yamazaki et al. |
| 7,245,277 B2 | 7/2007 | Ishizuka |
| 7,248,236 B2 | 7/2007 | Nathan et al. |
| 7,264,979 B2 | 9/2007 | Yamagata et al. |
| 7,274,345 B2 | 9/2007 | Imamura et al. |
| 7,274,363 B2 | 9/2007 | Ishizuka et al. |
| 7,279,711 B1 | 10/2007 | Yamazaki et al. |
| 7,304,621 B2 | 12/2007 | Oomori et al. |
| 7,310,092 B2 | 12/2007 | Imamura |
| 7,315,295 B2 | 1/2008 | Kimura |
| 7,317,429 B2 | 1/2008 | Shirasaki et al. |
| 7,319,465 B2 | 1/2008 | Mikami et al. |
| 7,321,348 B2 | 1/2008 | Cok et al. |
| 7,339,636 B2 | 3/2008 | Voloschenko et al. |
| 7,355,574 B1 | 4/2008 | Leon et al. |
| 7,358,941 B2 | 4/2008 | Ono et al. |
| 7,402,467 B1 | 7/2008 | Kadono et al. |
| 7,414,600 B2 | 8/2008 | Nathan et al. |
| 7,432,885 B2 | 10/2008 | Asano et al. |
| 7,474,285 B2 | 1/2009 | Kimura |
| 7,485,478 B2 | 2/2009 | Yamagata et al. |
| 7,502,000 B2 | 3/2009 | Yuki et al. |
| 7,535,449 B2 | 5/2009 | Miyazawa |
| 7,554,512 B2 | 6/2009 | Steer |
| 7,569,849 B2 | 8/2009 | Nathan et al. |
| 7,619,594 B2 | 11/2009 | Hu |
| 7,619,597 B2 | 11/2009 | Nathan et al. |
| 7,697,052 B1 | 4/2010 | Yamazaki et al. |
| 7,825,419 B2 | 11/2010 | Yamagata et al. |
| 7,859,492 B2 | 12/2010 | Kohno |
| 7,868,859 B2 | 1/2011 | Tomida et al. |
| 7,876,294 B2 | 1/2011 | Sasaki et al. |
| 7,948,170 B2 | 5/2011 | Striakhilev et al. |
| 7,969,390 B2 | 6/2011 | Yoshida |
| 7,995,010 B2 | 8/2011 | Yamazaki et al. |
| 8,044,893 B2 | 10/2011 | Nathan et al. |
| 8,115,707 B2 | 2/2012 | Nathan et al. |
| 8,378,362 B2 | 2/2013 | Heo et al. |
| 8,493,295 B2 | 7/2013 | Yamazaki et al. |
| 8,497,525 B2 | 7/2013 | Yamagata et al. |
| 8,643,028 B2 * | 2/2014 | Ban .................. F21S 9/037 257/40 |
| 2001/0002703 A1 | 6/2001 | Koyama |
| 2001/0004190 A1 | 6/2001 | Nishi et al. |
| 2001/0013806 A1 | 8/2001 | Notani |
| 2001/0015653 A1 | 8/2001 | De Jong et al. |
| 2001/0020926 A1 | 9/2001 | Kujik |
| 2001/0024186 A1 | 9/2001 | Kane |
| 2001/0026127 A1 | 10/2001 | Yoneda et al. |
| 2001/0026179 A1 | 10/2001 | Saeki |
| 2001/0026257 A1 | 10/2001 | Kimura |
| 2001/0030323 A1 | 10/2001 | Ikeda |
| 2001/0033199 A1 | 10/2001 | Aoki |
| 2001/0038098 A1 | 11/2001 | Yamazaki et al. |
| 2001/0043173 A1 | 11/2001 | Troutman |
| 2001/0045929 A1 | 11/2001 | Prache et al. |
| 2001/0052606 A1 | 12/2001 | Sempel et al. |
| 2001/0052898 A1 | 12/2001 | Osame et al. |
| 2002/0000576 A1 | 1/2002 | Inukai |
| 2002/0011796 A1 | 1/2002 | Koyama |
| 2002/0011799 A1 | 1/2002 | Kimura |
| 2002/0011981 A1 | 1/2002 | Kujik |
| 2002/0015031 A1 | 2/2002 | Fujita et al. |
| 2002/0015032 A1 | 2/2002 | Koyama et al. |
| 2002/0030528 A1 | 3/2002 | Matsumoto et al. |
| 2002/0030647 A1 | 3/2002 | Hack et al. |
| 2002/0036463 A1 | 3/2002 | Yoneda et al. |
| 2002/0047852 A1 | 4/2002 | Inukai et al. |
| 2002/0048829 A1 | 4/2002 | Yamazaki et al. |
| 2002/0050795 A1 | 5/2002 | Imura |
| 2002/0053401 A1 | 5/2002 | Ishikawa et al. |
| 2002/0070909 A1 | 6/2002 | Asano et al. |
| 2002/0080108 A1 | 6/2002 | Wang |
| 2002/0084463 A1 | 7/2002 | Sanford et al. |
| 2002/0101172 A1 | 8/2002 | Bu |
| 2002/0101433 A1 | 8/2002 | McKnight |
| 2002/0113248 A1 | 8/2002 | Yamagata et al. |
| 2002/0122308 A1 | 9/2002 | Ikeda |
| 2002/0130686 A1 | 9/2002 | Forbes |
| 2002/0154084 A1 | 10/2002 | Tanaka et al. |
| 2002/0158823 A1 | 10/2002 | Zavracky et al. |
| 2002/0163314 A1 | 11/2002 | Yamazaki et al. |
| 2002/0167471 A1 | 11/2002 | Everitt |
| 2002/0180369 A1 | 12/2002 | Koyama |
| 2002/0180721 A1 | 12/2002 | Kimura et al. |
| 2002/0186214 A1 | 12/2002 | Siwinski |
| 2002/0190332 A1 | 12/2002 | Lee et al. |
| 2002/0190924 A1 | 12/2002 | Asano et al. |
| 2002/0190971 A1 | 12/2002 | Nakamura et al. |
| 2002/0195967 A1 | 12/2002 | Kim et al. |
| 2002/0195968 A1 | 12/2002 | Sanford et al. |
| 2003/0020413 A1 | 1/2003 | Oomura |
| 2003/0030603 A1 | 2/2003 | Shimoda |
| 2003/0062524 A1 | 4/2003 | Kimura |
| 2003/0063081 A1 | 4/2003 | Kimura et al. |

(56) References Cited

U.S. PATENT DOCUMENTS

| | | |
|---|---|---|
| 2003/0071804 A1 | 4/2003 | Yamazaki et al. |
| 2003/0071821 A1 | 4/2003 | Sundahl |
| 2003/0076048 A1 | 4/2003 | Rutherford |
| 2003/0081158 A1* | 5/2003 | Li .................. G02F 1/13306 349/113 |
| 2003/0090445 A1 | 5/2003 | Chen et al. |
| 2003/0090447 A1 | 5/2003 | Kimura |
| 2003/0090481 A1 | 5/2003 | Kimura |
| 2003/0095087 A1 | 5/2003 | Libsch |
| 2003/0107560 A1 | 6/2003 | Yumoto et al. |
| 2003/0111966 A1 | 6/2003 | Mikami et al. |
| 2003/0122745 A1 | 7/2003 | Miyazawa |
| 2003/0140958 A1 | 7/2003 | Yang et al. |
| 2003/0151569 A1 | 8/2003 | Lee et al. |
| 2003/0169219 A1 | 9/2003 | LeChevalier |
| 2003/0174152 A1 | 9/2003 | Noguchi |
| 2003/0178617 A1 | 9/2003 | Appenzeller et al. |
| 2003/0179626 A1 | 9/2003 | Sanford et al. |
| 2003/0197663 A1 | 10/2003 | Lee et al. |
| 2003/0206060 A1 | 11/2003 | Suzuki |
| 2003/0230980 A1 | 12/2003 | Forrest et al. |
| 2004/0027063 A1 | 2/2004 | Nishikawa |
| 2004/0056604 A1 | 3/2004 | Shih et al. |
| 2004/0066357 A1 | 4/2004 | Kawasaki |
| 2004/0070557 A1 | 4/2004 | Asano et al. |
| 2004/0080262 A1 | 4/2004 | Park et al. |
| 2004/0080470 A1 | 4/2004 | Yamazaki et al. |
| 2004/0090400 A1 | 5/2004 | Yoo |
| 2004/0108518 A1 | 6/2004 | Jo |
| 2004/0113903 A1 | 6/2004 | Mikami et al. |
| 2004/0129933 A1 | 7/2004 | Nathan et al. |
| 2004/0130516 A1 | 7/2004 | Nathan et al. |
| 2004/0135749 A1 | 7/2004 | Kondakov et al. |
| 2004/0145547 A1 | 7/2004 | Oh |
| 2004/0150592 A1 | 8/2004 | Mizukoshi et al. |
| 2004/0150594 A1 | 8/2004 | Koyama et al. |
| 2004/0150595 A1 | 8/2004 | Kasai |
| 2004/0155841 A1 | 8/2004 | Kasai |
| 2004/0174347 A1 | 9/2004 | Sun et al. |
| 2004/0174349 A1 | 9/2004 | Libsch |
| 2004/0183759 A1 | 9/2004 | Stevenson et al. |
| 2004/0189627 A1 | 9/2004 | Shirasaki et al. |
| 2004/0196275 A1 | 10/2004 | Hattori |
| 2004/0201554 A1 | 10/2004 | Satoh |
| 2004/0207615 A1 | 10/2004 | Yumoto |
| 2004/0233125 A1 | 11/2004 | Tanghe et al. |
| 2004/0239596 A1 | 12/2004 | Ono et al. |
| 2004/0252089 A1 | 12/2004 | Ono et al. |
| 2004/0257355 A1 | 12/2004 | Naugler |
| 2004/0263437 A1 | 12/2004 | Hattori |
| 2005/0007357 A1 | 1/2005 | Yamashita et al. |
| 2005/0030267 A1 | 2/2005 | Tanghe et al. |
| 2005/0035709 A1 | 2/2005 | Furuie et al. |
| 2005/0067970 A1 | 3/2005 | Libsch et al. |
| 2005/0067971 A1 | 3/2005 | Kane |
| 2005/0068270 A1 | 3/2005 | Awakura |
| 2005/0088085 A1 | 4/2005 | Nishikawa et al. |
| 2005/0088103 A1 | 4/2005 | Kageyama et al. |
| 2005/0110420 A1 | 5/2005 | Arnold et al. |
| 2005/0117096 A1 | 6/2005 | Voloschenko et al. |
| 2005/0140276 A1 | 6/2005 | Park |
| 2005/0140598 A1 | 6/2005 | Kim et al. |
| 2005/0140610 A1 | 6/2005 | Smith et al. |
| 2005/0145891 A1 | 7/2005 | Abe |
| 2005/0156831 A1 | 7/2005 | Yamazaki et al. |
| 2005/0168416 A1 | 8/2005 | Hashimoto et al. |
| 2005/0206590 A1 | 9/2005 | Sasaki et al. |
| 2005/0225686 A1 | 10/2005 | Brummack et al. |
| 2005/0260777 A1 | 11/2005 | Brabec et al. |
| 2005/0269959 A1 | 12/2005 | Uchino et al. |
| 2005/0269960 A1 | 12/2005 | Ono et al. |
| 2005/0285822 A1 | 12/2005 | Reddy et al. |
| 2005/0285825 A1 | 12/2005 | Eom et al. |
| 2006/0007072 A1 | 1/2006 | Choi et al. |
| 2006/0012310 A1 | 1/2006 | Chen et al. |
| 2006/0027807 A1 | 2/2006 | Nathan et al. |
| 2006/0030084 A1 | 2/2006 | Young |
| 2006/0038758 A1 | 2/2006 | Routley et al. |
| 2006/0044227 A1 | 3/2006 | Hadcock |
| 2006/0066527 A1 | 3/2006 | Chou |
| 2006/0092185 A1 | 5/2006 | Jo et al. |
| 2006/0232522 A1 | 10/2006 | Roy et al. |
| 2006/0261841 A1 | 11/2006 | Fish |
| 2006/0264143 A1 | 11/2006 | Lee et al. |
| 2006/0273997 A1 | 12/2006 | Nathan et al. |
| 2006/0284801 A1 | 12/2006 | Yoon et al. |
| 2007/0001937 A1 | 1/2007 | Park et al. |
| 2007/0001939 A1 | 1/2007 | Hashimoto et al. |
| 2007/0008268 A1 | 1/2007 | Park et al. |
| 2007/0008297 A1 | 1/2007 | Bassetti |
| 2007/0046195 A1 | 3/2007 | Chin et al. |
| 2007/0069998 A1 | 3/2007 | Naugler et al. |
| 2007/0080905 A1 | 4/2007 | Takahara |
| 2007/0080906 A1 | 4/2007 | Tanabe |
| 2007/0080908 A1 | 4/2007 | Nathan et al. |
| 2007/0080918 A1 | 4/2007 | Kawachi et al. |
| 2007/0103419 A1 | 5/2007 | Uchino et al. |
| 2007/0182671 A1 | 8/2007 | Nathan et al. |
| 2007/0273294 A1 | 11/2007 | Nagayama |
| 2007/0285359 A1 | 12/2007 | Ono |
| 2007/0296672 A1 | 12/2007 | Kim et al. |
| 2008/0042948 A1 | 2/2008 | Yamashita et al. |
| 2008/0055209 A1 | 3/2008 | Cok |
| 2008/0074413 A1 | 3/2008 | Ogura |
| 2008/0088549 A1 | 4/2008 | Nathan et al. |
| 2008/0122803 A1 | 5/2008 | Izadi et al. |
| 2008/0230118 A1 | 9/2008 | Nakatani et al. |
| 2009/0032807 A1 | 2/2009 | Shinohara et al. |
| 2009/0051283 A1 | 2/2009 | Cok et al. |
| 2009/0160743 A1 | 6/2009 | Tomida et al. |
| 2009/0162961 A1 | 6/2009 | Deane |
| 2009/0174628 A1 | 7/2009 | Wang et al. |
| 2009/0213046 A1 | 8/2009 | Nam |
| 2010/0052524 A1 | 3/2010 | Kinoshita |
| 2010/0078230 A1 | 4/2010 | Rosenblatt et al. |
| 2010/0079711 A1 | 4/2010 | Tanaka |
| 2010/0097335 A1 | 4/2010 | Jung et al. |
| 2010/0133994 A1 | 6/2010 | Song et al. |
| 2010/0134456 A1 | 6/2010 | Oyamada |
| 2010/0140600 A1 | 6/2010 | Clough et al. |
| 2010/0156279 A1 | 6/2010 | Tamura et al. |
| 2010/0231528 A1 | 9/2010 | Wolfe et al. |
| 2010/0237374 A1 | 9/2010 | Chu et al. |
| 2010/0328294 A1 | 12/2010 | Sasaki et al. |
| 2011/0090210 A1 | 4/2011 | Sasaki et al. |
| 2011/0133636 A1 | 6/2011 | Matsuo et al. |
| 2011/0180825 A1 | 7/2011 | Lee et al. |
| 2012/0212468 A1 | 8/2012 | Govil |
| 2013/0009930 A1 | 1/2013 | Cho et al. |
| 2013/0032831 A1 | 2/2013 | Chaji et al. |
| 2013/0105930 A1 | 5/2013 | Zhang et al. |
| 2013/0113785 A1 | 5/2013 | Sumi |
| 2014/0225938 A1* | 8/2014 | Soni .................. G09G 3/3233 345/690 |
| 2016/0104751 A1 | 4/2016 | Sagardoyburu |
| 2016/0283012 A1 | 9/2016 | Long |

FOREIGN PATENT DOCUMENTS

| | | |
|---|---|---|
| CA | 2 249 592 | 7/1998 |
| CA | 2 368 386 | 9/1999 |
| CA | 2 242 720 | 1/2000 |
| CA | 2 354 018 | 6/2000 |
| CA | 2 436 451 | 8/2002 |
| CA | 2 438 577 | 8/2002 |
| CA | 2 483 645 | 12/2003 |
| CA | 2 463 653 | 1/2004 |
| CA | 2498136 | 3/2004 |
| CA | 2522396 | 11/2004 |
| CA | 2443206 | 3/2005 |
| CA | 2472671 | 12/2005 |
| CA | 2567076 | 1/2006 |
| CA | 2526782 | 4/2006 |
| CN | 1381032 | 11/2002 |

(56) References Cited

FOREIGN PATENT DOCUMENTS

| | | |
|---|---|---|
| CN | 1448908 | 10/2003 |
| CN | 1776922 | 5/2006 |
| CN | 101032027 A | 9/2007 |
| DE | 20 2006 00542 | 6/2006 |
| EP | 0 940 796 | 9/1999 |
| EP | 1 028 471 A | 8/2000 |
| EP | 1 103 947 | 5/2001 |
| EP | 1 130 565 A1 | 9/2001 |
| EP | 1 184 833 | 3/2002 |
| EP | 1 194 013 | 4/2002 |
| EP | 1 310 939 | 5/2003 |
| EP | 1 335 430 A1 | 8/2003 |
| EP | 1 372 136 | 12/2003 |
| EP | 1 381 019 | 1/2004 |
| EP | 1 418 566 | 5/2004 |
| EP | 1 429 312 A | 6/2004 |
| EP | 1 439 520 | 7/2004 |
| EP | 1 465 143 A | 10/2004 |
| EP | 1 467 408 | 10/2004 |
| EP | 1 517 290 | 3/2005 |
| EP | 1 521 203 A2 | 4/2005 |
| EP | 2317499 | 5/2011 |
| GB | 2 205 431 | 12/1988 |
| JP | 09 090405 | 4/1997 |
| JP | 10-153759 | 6/1998 |
| JP | 10-254410 | 9/1998 |
| JP | 11 231805 | 8/1999 |
| JP | 11-282419 | 10/1999 |
| JP | 2000/056847 | 2/2000 |
| JP | 2000-077192 | 3/2000 |
| JP | 2000-089198 | 3/2000 |
| JP | 2000-352941 | 12/2000 |
| JP | 2002-91376 | 3/2002 |
| JP | 2002-268576 | 9/2002 |
| JP | 2002-278513 | 9/2002 |
| JP | 2002-333862 | 11/2002 |
| JP | 2003-022035 | 1/2003 |
| JP | 2003-076331 | 3/2003 |
| JP | 2003-150082 | 5/2003 |
| JP | 2003-177709 | 6/2003 |
| JP | 2003-271095 | 9/2003 |
| JP | 2003-308046 | 10/2003 |
| JP | 2005-057217 | 3/2005 |
| JP | 2006065148 | 3/2006 |
| JP | 2009282158 | 12/2009 |
| TW | 485337 | 5/2002 |
| TW | 502233 | 9/2002 |
| TW | 538650 | 6/2003 |
| TW | 569173 | 1/2004 |
| WO | WO 94/25954 | 11/1994 |
| WO | WO 99/48079 | 9/1999 |
| WO | WO 01/27910 A1 | 4/2001 |
| WO | WO 02/067327 A | 8/2002 |
| WO | WO 03/034389 A | 4/2003 |
| WO | WO 03/063124 | 7/2003 |
| WO | WO 03/077231 | 9/2003 |
| WO | WO 03/105117 | 12/2003 |
| WO | WO 2004/003877 | 1/2004 |
| WO | WO 2004/034364 | 4/2004 |
| WO | WO 2005/022498 | 3/2005 |
| WO | WO 2005/029455 | 3/2005 |
| WO | WO 2005/055185 | 6/2005 |
| WO | WO 2006/053424 | 5/2006 |
| WO | WO 2006/063448 A | 6/2006 |
| WO | WO 2006/137337 | 12/2006 |
| WO | WO 2007/003877 A | 1/2007 |
| WO | WO 2007/079572 | 7/2007 |
| WO | WO 2010/023270 | 3/2010 |

OTHER PUBLICATIONS

Alexander et al.: "Pixel circuits and drive schemes for glass and elastic AMOLED displays"; dated Jul. 2005 (9 pages).
Alexander et al.: "Unique Electrical Measurement Technology for Compensation, Inspection, and Process Diagnostics of AMOLED HDTV"; dated May 2010 (4 pages).
Ashtiani et al.: "AMOLED Pixel Circuit With Electronic Compensation of Luminance Degradation"; dated Mar. 2007 (4 pages).
Chaji et al.: "A Current-Mode Comparator for Digital Calibration of Amorphous Silicon AMOLED Displays"; dated Jul. 2008 (5 pages).
Chaji et al.: "A fast settling current driver based on the CCII for AMOLED displays"; dated Dec. 2009 (6 pages).
Chaji et al.: "A Low-Cost Stable Amorphous Silicon AMOLED Display with Full V~T- and V~O~L~E~D Shift Compensation"; dated May 2007 (4 pages).
Chaji et al.: "A low-power driving scheme for a-Si:H active-matrix organic light-emitting diode displays"; dated Jun. 2005 (4 pages).
Chaji et al.: "A low-power high-performance digital circuit for deep submicron technologies"; dated Jun. 2005 (4 pages).
Chaji et al.: "A novel a-Si:H AMOLED pixel circuit based on short-term stress stability of a-Si:H TFTs"; dated Oct. 2005 (3 pages).
Chaji et al.: "A Novel Driving Scheme and Pixel Circuit for AMOLED Displays"; dated Jun. 2006 (4 pages).
Chaji et al.: "A novel driving scheme for high-resolution large-area a-Si:H AMOLED displays"; dated Aug. 2005 (4 pages).
Chaji et al.: "A Stable Voltage-Programmed Pixel Circuit for a-Si:H AMOLED Displays"; dated Dec. 2006 (12 pages).
Chaji et al.: "A Sub-µA fast-settling current-programmed pixel circuit for AMOLED displays"; dated Sep. 2007.
Chaji et al.: "An Enhanced and Simplified Optical Feedback Pixel Circuit for AMOLED Displays"; dated Oct. 2006.
Chaji et al.: "Compensation technique for DC and transient instability of thin film transistor circuits for large-area devices"; dated Aug. 2008.
Chaji et al.: "Driving scheme for stable operation of 2-TFT a-Si AMOLED pixel"; dated Apr. 2005 (2 pages).
Chaji et al.: "Dynamic-effect compensating technique for stable a-Si:H AMOLED displays"; dated Aug. 2005 (4 pages).
Chaji et al.: "Electrical Compensation of OLED Luminance Degradation"; dated Dec. 2007 (3 pages).
Chaji et al.: "eUTDSP: a design study of a new VLIW-based DSP architecture"; dated May 2003 (4 pages).
Chaji et al.: "Fast and Offset-Leakage Insensitive Current-Mode Line Driver for Active Matrix Displays and Sensors"; dated Feb. 2009 (8 pages).
Chaji et al.: "High Speed Low Power Adder Design With a New Logic Style: Pseudo Dynamic Logic (SDL)"; dated Oct. 2001 (4 pages).
Chaji et al.: "High-precision, fast current source for large-area current-programmed a-Si flat panels"; dated Sep. 2006 (4 pages).
Chaji et al.: "Low-Cost AMOLED Television with IGNIS Compensating Technology"; dated May 2008 (4 pages).
Chaji et al.: "Low-Cost Stable a-Si:H AMOLED Display for Portable Applications"; dated Jun. 2006 (4 pages).
Chaji et al.: "Low-Power Low-Cost Voltage-Programmed a-Si:H AMOLED Display"; dated Jun. 2008 (5 pages).
Chaji et al.: "Merged phototransistor pixel with enhanced near infrared response and flicker noise reduction for biomolecular imaging"; dated Nov. 2008 (3 pages).
Chaji et al.: "Parallel Addressing Scheme for Voltage-Programmed Active-Matrix OLED Displays"; dated May 2007 (6 pages).
Chaji et al.: "Pseudo dynamic logic (SDL): a high-speed and low-power dynamic logic family"; dated 2002 (4 pages).
Chaji et al.: "Stable a-Si:H circuits based on short-term stress stability of amorphous silicon thin film transistors"; dated May 2006 (4 pages).
Chaji et al.: "Stable Pixel Circuit for Small-Area High-Resolution a-Si:H AMOLED Displays"; dated Oct. 2008 (6 pages).
Chaji et al.: "Stable RGBW AMOLED display with OLED degradation compensation using electrical feedback"; dated Feb. 2010 (2 pages).
Chaji et al.: "Thin-Film Transistor Integration for Biomedical Imaging and AMOLED Displays"; dated 2008 (177 pages).
European Search Report and Written Opinion for Application No. 08 86 5338 dated Nov. 2, 2011 (7 pages).

(56) References Cited

OTHER PUBLICATIONS

European Search Report for European Application No. EP 04 78 6661 dated Mar. 9, 2009.
European Search Report for European Application No. EP 05 75 9141 dated Oct. 30, 2009.
European Search Report for European Application No. EP 05 82 1114 dated Mar. 27, 2009 (2 pages).
European Search Report for European Application No. EP 07 71 9579 dated May 20, 2009.
European Search Report dated Mar. 26, 2012 in corresponding European Patent Application No. 10000421.7 (6 pages).
Extended European Search Report dated Apr. 27, 2011 issued during prosecution of European patent application No. 09733076.5 (13 pages).
Goh et al., "A New a-Si:H Thin Film Transistor Pixel Circul for Active-Matrix Organic Light-Emitting Diodes", IEEE Electron Device Letters, vol. 24, No. 9, Sep. 2003, 4 pages.
International Search Report for International Application No. PCT/CA02/00180 dated Jul. 31, 2002 (3 pages).
International Search Report for International Application No. PCT/CA2004/001741 dated Feb. 21, 2005.
International Search Report for International Application No. PCT/CA2005/001844 dated Mar. 28, 2006 (2 pages).
International Search Report for International Application No. PCT/CA2005/001007 dated Oct. 18, 2005.
International Search Report for International Application No. PCT/CA2007/000652 dated Jul. 25, 2007.
International Search Report for International Application No. PCT/CA2008/002307, dated Apr. 28, 2009 (3 pages).
International Search Report for International Application No. PCT/IB2011/055135, Canadian Patent Office, dated Apr. 16, 2012 (5 pages).
International Search Report dated Jul. 30, 2009 for International Application No. PCT/CA2009/000501 (4 pages).
Jafarabadiashtiani et al.: "A New Driving Method for a-Si AMOLED Displays Based on Voltage Feedback"; dated 2005 (4 pages).
Lee et al.: "Ambipolar Thin-Film Transistors Fabricated by PECVD Nanocrystalline Silicon"; dated 2006 (6 pages).
Ma e y et al: "Organic Light-Emitting Diode/Thin Film Transistor Integration for foldable Displays" Conference record of the 1997 International display research conference and international workshops on LCD technology and emissive technology. Toronto, Sep. 15-19, 1997 (6 pages).
Matsueda y et al.: "35.1: 2.5-in. AMOLED with Integrated 6-bit Gamma Compensated Digital Data Driver"; dated May 2004.
Nathan et al.: "Backplane Requirements for Active Matrix Organic Light Emitting Diode Displays"; dated 2006 (16 pages).
Nathan et al.: "Call for papers second international workshop on compact thin-film transistor (TFT) modeling for circuit simulation"; dated Sep. 2009 (1 page).
Nathan et al.: "Driving schemes for a-Si and LTPS AMOLED displays"; dated Dec. 2005 (11 pages).
Nathan et al.: "Invited Paper: a-Si for AMOLED—Meeting the Performance and Cost Demands of Display Applications (Cell Phone to HDTV)"; dated 2006 (4 pages).
Nathan et al.: "Thin film imaging technology on glass and plastic" ICM 2000, Proceedings of the 12$^{th}$ International Conference on Microelectronics, (IEEE Cat. No. 00EX453), Tehran Iran; dated Oct. 31-Nov. 2, 2000, pp. 11-14, ISBN: 964-360-057-2, p. 13, col. 1, line 11-48; (4 pages).
Nathan et al., "Amorphous Silicon Thin Film Transistor Circuit Integration for Organic LED Displays on Glass and Plastic", IEEE Journal of Solid-State Circuits, vol. 39, No. 9, Sep. 2004, pp. 1477-1486.
Office Action issued in Chinese Patent Application 200910246264.4 dated Jul. 5, 2013; 8 pages.
Patent Abstracts of Japan, vol. 2000, No. 09, Oct. 13, 2000—JP 2000 172199 A, Jun. 3, 2000, abstract.
Patent Abstracts of Japan, vol. 2002, No. 03, Apr. 3, 2002 (Apr. 4, 2004 & JP 2001 318627 A (Semiconductor EnergyLab DO LTD), Nov. 16, 2001, abstract, paragraphs '01331-01801, paragraph '01691, paragraph '01701, paragraph '01721 and figure 10.
Philipp: "Charge transfer sensing" Sensor Review, vol. 19, No. 2, Dec. 31, 1999 (Dec. 31, 1999), 10 pages.
Rafati et al.: "Comparison of a 17 b multiplier in Dual-rail domino and in Dual-rail D L (D L) logic styles"; dated 2002 (4 pages).
Safavaian et al.: "Three-TFT image sensor for real-time digital X-ray imaging"; dated Feb. 2, 2006 (2 pages).
Safavian et al.: "3-TFT active pixel sensor with correlated double sampling readout circuit for real-time medical x-ray imaging"; dated Jun. 2006 (4 pages).
Safavian et al.: "A novel current scaling active pixel sensor with correlated double sampling readout circuit for real time medical x-ray imaging"; dated May 2007 (7 pages).
Safavian et al.: "A novel hybrid active-passive pixel with correlated double sampling CMOS readout circuit for medical x-ray imaging"; dated May 2008 (4 pages).
Safavian et al.: "Self-compensated a-Si:H detector with current-mode readout circuit for digital X-ray fluoroscopy"; dated Aug. 2005 (4 pages).
Safavian et al.: "TFT active image sensor with current-mode readout circuit for digital x-ray fluoroscopy [5969D-82]"; dated Sep. 2005 (9 pages).
Sanford, James L., et al., "4.2 TFT AMOLED Pixel Circuits and Driving Methods", SID 03 Digest, ISSN/0003, 2003, pp. 10-13.
Stewart M. et al., "Polysilicon TFT technology for active matrix OLED displays" IEEE transactions on electron devices, vol. 48, No. 5; Dated May 2001 (7 pages).
Tatsuya Sasaoka et al., "24.4L; Late-News Paper: A 13.0-inch AM-Oled Display with Top Emitting Structure and Adaptive Current Mode Programmed Pixel Circuit (TAC)", SID 01 Digest, (2001), pp. 384-387.
Vygranenko et al.: "Stability of indium-oxide thin-film transistors by reactive ion beam assisted deposition"; dated 2009.
Wang et al.: "Indium oxides by reactive ion beam assisted evaporation: From material study to device application"; dated Mar. 2009 (6 pages).
Written Opinion dated Jul. 30, 2009 for International Application No. PCT/CA2009/000501 (6 pages).
Yi He et al., "Current-Source a-Si:H Thin Film Transistor Circuit for Active-Matrix Organic Light-Emitting Displays", IEEE Electron Device Letters, vol. 21, No. 12, Dec. 2000, pp. 590-592.
Zhiguo Meng et al; "24.3: Active-Matrix Organic Light-Emitting Diode Display implemented Using Metal-Induced Unilaterally Crystallized Polycrystalline Silicon Thin-Film Transistors", SID 01Digest, (2001), pp. 380-383.
International Search Report for Application No. PCT/IB2014/059409, Canadian Intellectual Property Office, dated Jun. 12, 2014 (4 pages).
Written Opinion for Application No. PCT/IB2014/059409, Canadian Intellectual Property Office, dated Jun. 12, 2014 (5 pages).
Extended European Search Report for Application No. EP 14181848.4, dated Mar. 5, 2015, (9 pages).

* cited by examiner

MULTI-FUNCTIONAL ACTIVE MATRIX ORGANIC LIGHT-EMITTING DIODE DISPLAY

CROSS-REFERENCE TO RELATED APPLICATIONS

This application is a continuation of U.S. patent application Ser. No. 15/174,174, filed Jun. 6, 2016, now allowed, which is a continuation of U.S. patent application Ser. No. 13/689,241, filed Nov. 29, 2012, now U.S. Pat. No. 9,385,169, which claims priority to U.S. Provisional Application No. 61/564,634 filed Nov. 29, 2011, each of which is hereby incorporated by reference herein in its entirety.

FIELD OF THE INVENTION

The present invention relates generally to active matrix displays organic light-emitting diode (AMOLED) displays and, more particularly, to multi-functional AMOLED displays having integrated solar cells.

BACKGROUND OF THE INVENTION

Organic light-emitting diodes (OLEDs) have attracted significant attention because of their great potential for making next-generation flat panel displays, i.e., active-matrix organic light-emitting diode displays (AMOLEDs). The standard OLEDs consist of a transparent electrode, organic layers and a metallic reflective electrode, which experience a strong ambient light reflection and a reduced contrast of displays operating under sunlight, mandating a circular polarizer. Other approaches, such as black cathodes, have been proposed. However, all these designs absorb and waste the incident ambient light and a significant amount of light emitted by the OLEDs. In addition, AMOLEDs today are typically integrated with a touch panel in front of the AMOLED in many applications such as cellular phones, personal digital assistants (PDAs), computer displays and touch tablets. The light output from the OLEDs is further reduced by the touch panel. Altogether, the AMOLED display system is complex and costly, and exhibits relatively low efficiency and wastes a large amount of energy.

SUMMARY OF THE INVENTION

In accordance with one embodiment, a multi-functional active matrix display comprises a transparent front sheet, a semi-transparent layer of light emissive devices adjacent the rear side of the front sheet and forming a matrix of display pixels, and a solar cell layer located behind the light emissive devices for converting both ambient light and internal light from the light emissive devices into electrical energy, the solar cell layer including an array of electrodes on the front surface of the solar cell layer for use in detecting the location of a change in the amount of light impinging on a portion of the front surface of the solar cell layer.

In one implementation, the semi-transparent layer of light emissive devices includes a substantially transparent anode adjacent the transparent front sheet, a semi-transparent semiconductor stack forming organic light emitting diodes adjacent the rear side of the anode, and a semi-transparent cathode adjacent the rear side of the semiconductor stack. A cover glass is spaced rearwardly of the cathode, covering the solar cell layer, and a peripheral sealant bonds the cover glass to the front sheet. The peripheral sealant holds the cover sheet spaced away from the rear side of said cathode to form an air gap between the cathode and said the sheet.

This integration of the semi-transparent OLED panel and the solar panel offers ease of fabrication and low cost while providing advantages of multi-functionality such as low ambient light reflection, low power consumption, high yield and optical touch screen functionality. Specifically, the integrated device permits the touching of portions of the front surface of an active matrix OLED display to be sensed by using the solar panel to produce an electrical output signal corresponding to light that passes through said OLED display, including light reflected from an object touching the front surface of said OLED display. Then the location of the touching object can be determined by monitoring and analyzing the electrical output signals produced by said solar panel, using conventional touch-screen circuitry.

With this design, the incident ambient light and the portion of light emitted through the transparent electrode is absorbed by the back solar cell instead of being reflected, resulting in improved contrast in the displayed image. Moreover, in contrast with the polarizer and black cathode approaches, the absorbed light is recycled as useful electrical power or touch feedback instead of being converted to heat. At the same time, the display system can be manufactured with high yields by using independent panel and solar cell processes. Since the polarizer used in AMOLED displays typically has only about 43% transmittance, displays lose 57% of their electroluminance by using the polarizer.

Using the display system itself as an optical-based touch screen, without extra IR-LEDs and sensors, reduces the device complexity and fabrication cost of the display system by eliminating the need for extra IR-LEDs and sensors. The solar cell can also be used for initial uniformity calibration of the display, e.g., for correcting non-uniformities of an active matrix OLED display by (a) integrating the OLED display with a solar panel that produces an electrical output signal corresponding to light emissions from the OLED display, (b) detecting non-uniformities in the OLED display from said output signal, and (c) correcting the detected non-uniformities in the OLED display.

This display system has a simple structure that exhibits superior contrast without sacrificing electroluminance, a high power efficiency by recycling OLED internal emissions as well as incident ambient light, and touch screen functionality.

BRIEF DESCRIPTION OF THE DRAWINGS

The foregoing and other advantages of the present disclosure will become apparent upon reading the following detailed description and upon reference to the drawings.

DETAILED DESCRIPTION OF THE ILLUSTRATED EMBODIMENTS

Although the invention will be described in connection with certain aspects and/or embodiments, it will be understood that the invention is not limited to those particular aspects and/or embodiments. On the contrary, the invention is intended to cover all alternatives, modifications, and equivalent arrangements as may be included within the spirit and scope of the invention as defined by the appended claims.

Figure 1:
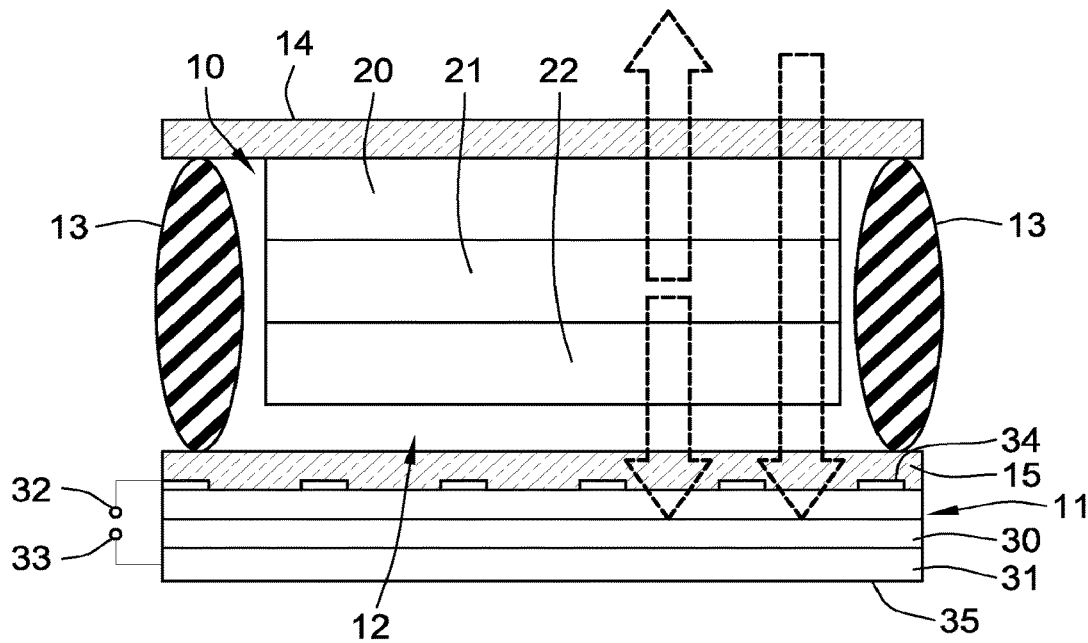
FIG. 1 is diagrammatic side elevation of an active matrix display that includes integrated solar cell and semi-transparent OLED layers.

FIG. 1 illustrates a display system that includes a semi-transparent OLED layer 10 integrated with a solar panel 11 separated from the OLED layer 10 by an air gap 12. The OLED layer 10 includes multiple pixels arranged in an X-Y matrix that is combined with programming, driving and control lines connected to the different rows and columns of the pixels. A peripheral sealant 13 (e.g., epoxy) holds the two layers 10 and 11 in the desired positions relative to each other. The OLED layer 10 has a glass substrate 14, the solar panel 11 has a glass cover 15, and the sealant 13 is bonded to the opposed surfaces of the substrate 14 and the cover 15 to form an integrated structure.

The OLED layer 10 includes a substantially transparent anode 20, e.g., indium-tin-oxide (ITO), adjacent the glass substrate 14, an organic semiconductor stack 21 engaging the rear surface of the anode 20, and a cathode 22 engaging the rear surface of the stack 21. The cathode 22 is made of a transparent or semi-transparent material, e.g., thin silver (Ag), to allow light to pass through the OLED layer 10 to the solar panel 11. (The anode 20 and the semiconductor stack 21 in OLEDs are typically at least semi-transparent, but the cathode in previous OLEDs has often been opaque and sometimes even light-absorbing to minimize the reflection of ambient light from the OLED.)

Light that passes rearwardly through the OLED layer 10, as illustrated by the right-hand arrow in FIG. 1, continues on through the air gap 12 and the cover glass cover 15 of the solar cell 11 to the junction between n-type and p-type semiconductor layers 30 and 31 in the solar cell. Optical energy passing through the glass cover 15 is converted to electrical energy by the semiconductor layers 30 and 31, producing an output voltage across a pair of output terminals 32 and 33. The various materials that can be used in the layers 30 and 31 to convert light to electrical energy, as well as the material dimensions, are well known in the solar cell industry. The positive output terminal 32 is connected to the n-type semiconductor layer 30 (e.g., copper phthalocyanine) by front electrodes 34 attached to the front surface of the layer 30. The negative output terminal 33 is connected to the p-type semiconductor layer 31 (e.g., 3, 4, 9, 10-perylenetetracarboxylic bis-benzimidazole) by rear electrodes 35 attached to the rear surface of the layer 31.

One or more switches may be connected to the terminals 32 and 33 to permit the solar panel 11 to be controllably connected to either (1) an electrical energy storage device such as a rechargeable battery or one or more capacitors, or (2) to a system that uses the solar panel 11 as a touch screen, to detect when and where the front of the display is "touched" by a user.

In the illustrative embodiment of FIG. 1, the solar panel 11 is used to form part of the encapsulation of the OLED layer 10 by forming the rear wall of the encapsulation for the entire display. Specifically, the cover glass 15 of the solar cell array forms the rear wall of the encapsulation for the OLED layer 10, the single glass substrate 14 forms the front wall, and the perimeter sealant 13 forms the side walls.

One example of a suitable semitransparent OLED layer 10 includes the following materials:

Anode 20
ITO (100 nm)
Semiconductor Stack 21
hole transport layer—N,N'-bis(naphthalen-1-yl)-N,N'-bis(phenyl)benzidine (NBP) (70 nm)
emitter layer—tris(8-hydroxyquinoline) aluminum ($Alq_3$): 10-(2-benzothiazolyl)-1,1,7,7-tetramethyl-2,3,6,7-tetrahydro-1H, 5H, 11H, [1] benzo-pyrano[6,7,8-ij]quinolizin-11-one (C545T) (99%:1%) (30 nm)
electron transport layer—Alq3 (40 nm)
electron injection layer—4,7-diphenyl-1,10-phenanthroline (Bphen): (Cs2CO3) (9:1) (10 nm)
Semitransparent Cathode 22—
MoO3:NPB (1:1) (20 nm)
Ag (14 nm)
MoO3:NPB (1:1) (20 nm)

The performance of the above OLED layer in an integrated device using a commercial solar panel was compared with a reference device, which was an OLED with exactly the same semiconductor stack and a metallic cathode (Mg/Ag). The reflectance of the reference device was very high, due to the reflection of the metallic electrode; in contrast, the reflectance of the integrated device is very low. The reflectance of the integrated device with the transparent electrode was much lower than the reflectances of both the reference device (with the metallic electrode) and the reference device equipped with a circular polarizer.

Figure 2:
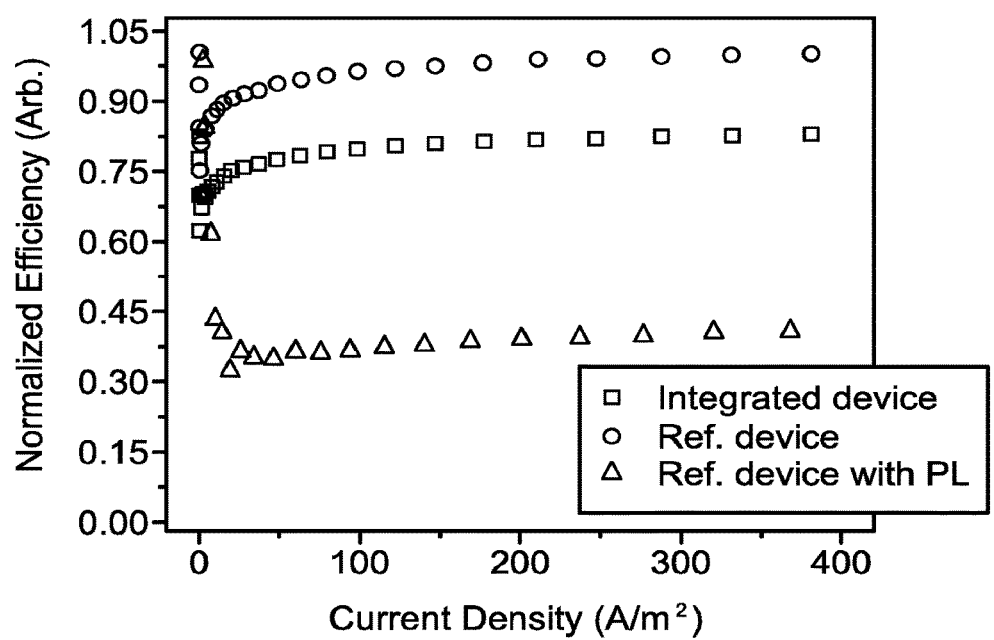
FIG. 2 is a plot of current efficiency vs. current density for the integrated device of FIG. 1 and a reference device.

The current efficiency-current density characteristics of the integrated device with the transparent electrode and the reference device are shown in FIG. 2. At a current density of 200 $A/m^2$, the integrated device with the transparent electrode had a current efficiency of 5.88 cd/A, which was 82.8% of the current efficiency (7.1 cd/A) of the reference device. The current efficiency of the reference device with a circular polarizer was only 60% of the current efficiency of the reference device. The integrated device converts both the incident ambient light and a portion of the OLED internal luminance into useful electrical energy instead of being wasted.

For both the integrated device and the reference device described above, all materials were deposited sequentially at a rate of 1-3 Å/s using vacuum thermal evaporation at a pressure below $5 \times 10^{-6}$ Torr on ITO-coated glass substrates. The substrates were cleaned with acetone and isopropyl alcohol, dried in an oven, and finally cleaned by UV ozone treatment before use. In the integrated device, the solar panel was a commercial Sanyo Energy AM-1456CA amorphous silicon solar cell with a short circuit current of 6 µA and a voltage output of 2.4V. The integrated device was fabricated using the custom cut solar cell as encapsulation glass for the OLED layer.

The optical reflectance of the device was measured by using a Shimadzu UV-2501PC UV-Visible spectrophotometer. The current density (J)-luminance (L)-voltage (V) characteristics of the device was measured with an Agilent 4155C semiconductor parameter analyzer and a silicon photodiode pre-calibrated by a Minolta Chromameter. The ambient light was room light, and the tests were carried out at room temperature. The performances of the fabricated devices were compared with each other and with the reference device equipped with a circular polarizer.

Figure 3:
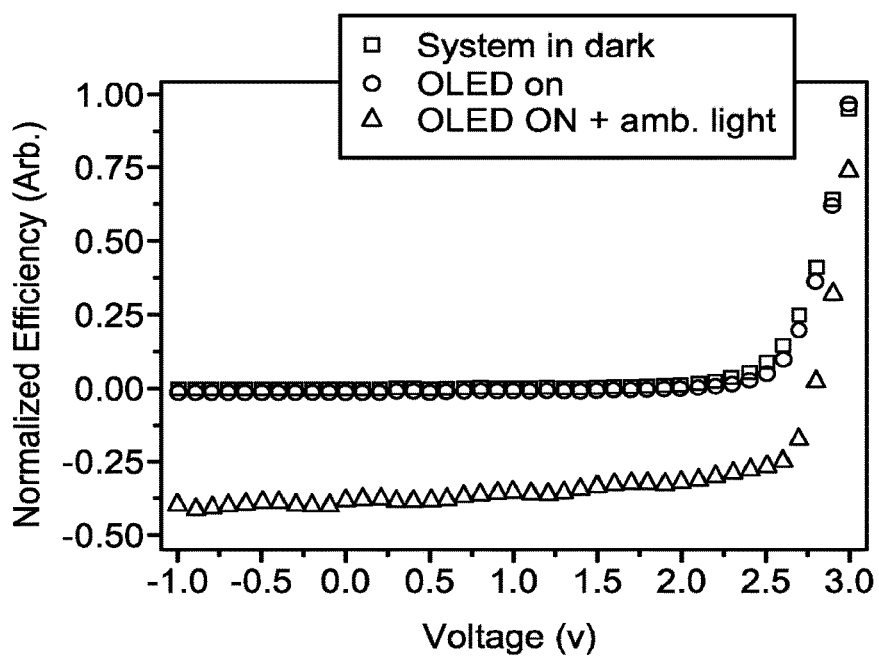
FIG. 3 is a plot of current efficiency vs. voltage for the integrated device of FIG. 1 with the solar cell in a dark environment, under illumination of the OLED layer, and under illumination of both the OLED layer and ambient light.

FIG. 3 shows current-voltage (I-V) characteristics of the solar panel (1) in dark, (2) under the illumination of OLED, and (3) under illumination of both ambient light and the OLED at 20 mA/cm$^2$. The dark current of the solar cell shows a nice diode characteristic. When the solar cell is under the illumination of the OLED under 20 mA/cm$^2$ current density, the solar cell shows a short circuit current ($O_{sc}$) of −0.16 µA, an open circuit voltage ($V_{oc}$) of 1.6V, and a filling factor (FF) of 0.31. The maximum converted electrical power is 0.08 µW, which demonstrates that the integrated device is capable of recycling a portion of the internal OLED luminance energy. When the solar cell is under the illumination of both ambient light and the overlying OLED, the solar cell shows a short circuit current ($I_{sc}$) of −7.63 µA, an open circuit voltage ($V_{oc}$) of 2.79V, and a filling factor (FF) of 0.65. The maximum converted electrical power is 13.8 µW in this case. The increased electrical power comes from the incident ambient light.

Overall, the integrated device shows a higher current efficiency than the reference device with a circular polarizer, and further recycles the energy of the incident ambient light and the internal luminance of the top OLED, which demonstrates a significant low power consumption display system.

Conventional touch displays stack a touch panel on top of an LCD or AMOLED display. The touch panel reduces the luminance output of the display beneath the touch panel and adds extra cost to the fabrication. The integrated device described above is capable of functioning as an optical-based touch screen without any extra panels or cost. Unlike previous optical-based touch screens which require extra IR-LEDs and sensors, the integrated device described here utilizes the internal illumination from the top OLED as an optical signal, and the solar cell is utilized as an optical sensor. Since the OLED has very good luminance uniformity, the emitted light is evenly spread across the device surface as well as the surface of the solar panel. When the front surface of the display is touched by a finger or other object, a portion of the emitted light is reflected off the object back into the device and onto the solar panel, which changes the electrical output of the solar panel. The system is able to detect this change in the electrical output, thereby detecting the touch. The benefit of this optical-based touch system is that it works for any object (dry finger, wet finger, gloved finger, stylus, pen, etc.), because detection of the touch is based on the optical reflection rather than a change in the refractive index, capacitance or resistance of the touch panel.

Figure 4:
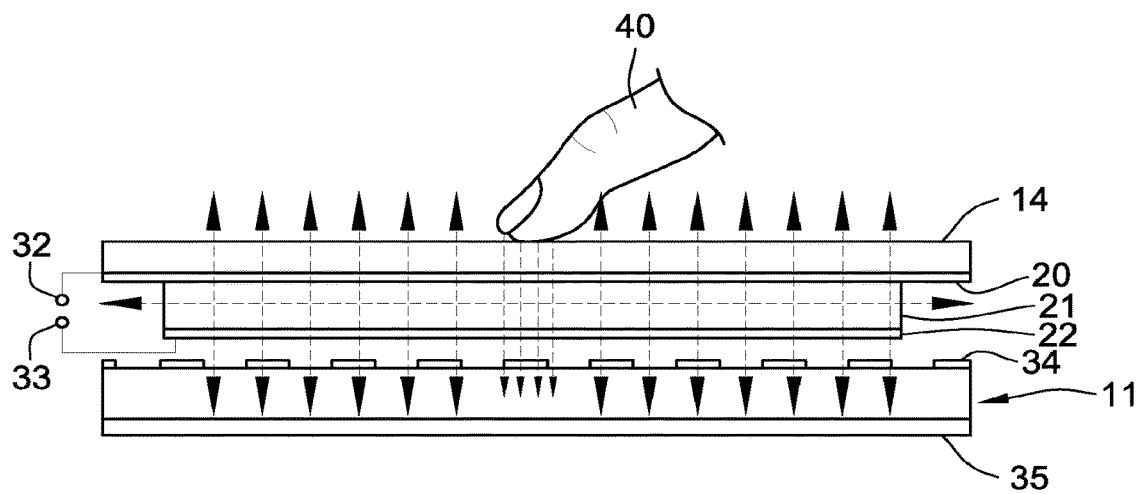
FIG. 4 is a diagrammatic illustration of the integrated device of FIG. 1 operating as an optical-based touch screen.

FIG. 4 is a diagrammatic illustration of the integrated device of FIG. 1 being used as a touch screen. To allow the solar cell to convert a significant amount of light that impinges on the front of the cell, the front electrodes 34 are spaced apart to leave a large amount of open area through which impinging light can pass to the front semiconductor layer 30. The illustrative electrode pattern in FIG. 4 has all the front electrodes 34 extending in the X direction, and all the back contacts 35 extending in the Y direction. Alternatively, one electrode can be patterned in both directions. An additional option is the addition of tall wall traces covered with metal so that they can be connected to the OLED transparent electrode to further reduce the resistance. Another option is to fill the gap 12 between the OLED layer 10 and the cover glass 15 with a transparent material that acts as an optical glue, for better light transmittance.

When the front of the display is touched or obstructed by a finger 40 (FIG. 4) or other object that reflects or otherwise changes the amount of light impinging on the solar panel at a particular location, the resulting change in the electrical output of the solar panel can be detected. The electrodes 34 and 35 are all individually connected to a touch screen controller circuit that monitors the current levels in the individual electrodes, and/or the voltage levels across different pairs of electrodes, and analyzes the location responsible for each change in those current and/or voltage levels. Touch screen controller circuits are well known in the touch-screen industry, and are capable of quickly and accurately reading the exact position of a "touch" that causes a change in the electrode currents and/or voltages being monitored. The touch screen circuits may be active whenever the display is active, or a proximity switch can be sued to activate the touch screen circuits only when the front surface of the display is touched.

The solar panel may also be used for imaging, as well as a touch screen. An algorithm may be used to capture multiple images, using different pixels of the display to provide different levels of brightness for compressive sensing.

Figure 5:
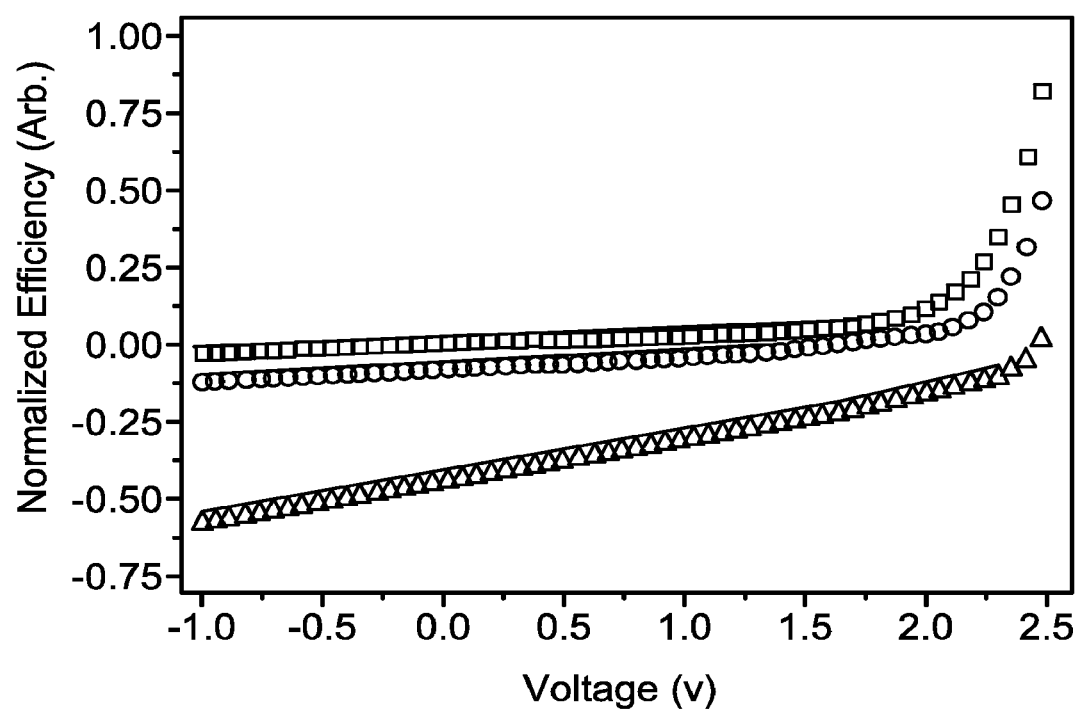
FIG. 5 is a plot of current efficiency vs. voltage for the integrated device of FIG. 1 with the solar cell in a dark environment, under illumination of the OLED layer with and without touch.

FIG. 5 is a plot of normalized current $I_{sc}$ vs. voltage $V_{oc}$ characteristics of the solar panel under the illumination of the overlying OLED layer, with and without touch. When the front of the integrated device is touched, $I_{sc}$ and $V_{oc}$ of the solar cell change from −0.16 µA to −0.87 µA and 1.6 V to 2.46 V, respectively, which allows the system to detect the touch. Since this technology is based on the contrast between the illuminating background and the light reflected by a fingertip, for example, the ambient light has an influence on the touch sensitivity of the system. The changes in $I_{sc}$ or $V_{oc}$ in FIG. 5 are relatively small, but by improving the solar cell efficiency and controlling the amount of background luminance by changing the thickness of the semitransparent cathode of the OLED, the contrast can be further improved. In general, a thinner semitransparent OLED cathode will benefit the luminance efficiency and lower the ambient light reflectance; however, it has a negative influence on the contrast of the touch screen.

In a modified embodiment, the solar panel is calibrated with different OLED and/or ambient brightness levels, and the values are stored in a lookup table (LUT). Touchiong the surface of the display changes the optical behavior of the stacked structure, and an expected value for each cell can be fetched from the LUT based on the OLED luminance and the ambient light. The output voltage or current from the solar cells can then be read, and a profile created based on differences between expected values and measured values. A predefined library or dictionary can be used to translate the created profile to different gestures or touch functions.

In another modified embodiment, each solar cell unit represents a pixel or sub-pixel, and the solar cells are calibrated as smaller units (pixel resolution) with light sources at different colors. Each solar cell unit may represent a cluster of pixels or sub-pixels. The solar cells are calibrated as smaller units (pixel resolution) with reference light sources at different color and brightness levels, and the values stored in LUTs or used to make functions. The calibration measurements can be repeated during the display lifetime by the user or at defined intervals based on the usage of the display. Calibrating the input video signals with the values stored in the LUTs can compensate for non-uniformity and aging. Different gray scales may be applied while measuring the values of each solar cell unit, and storing the values in a LUT.

Each solar cell unit can represent a pixel or sub-pixel. The solar cell can be calibrated as smaller units (pixel resolution) with reference light sources at different colors and brightness levels and the values stored in LUTs or used to make functions. Different gray scales may be applied while measuring the values of each solar cell unit, and then calibrating the input video signals with the values stored in the LUTs to compensate for non-uniformity and aging. The calibration measurements can be repeated during the display lifetime by the user or at defined intervals based on the usage of the display.

Alternatively, each solar cell unit can represent a pixel or sub-pixel, calibrated as smaller units (pixel resolution) with reference light sources at different colors and brightness levels with the values being stored in LUTs or used to make functions, and then applying different patterns (e.g., created as described in U.S. Patent Application Publication No. 2011/0227964, which is incorporated by reference in its entirety herein) to each cluster and measuring the values of each solar cell unit. The functions and methods described in U.S. Patent Application Publication No. 2011/0227964 may be used to extract the non-uniformities/aging for each pixel in the clusters, with the resulting values being stored in a LUT. The input video signals may then be calibrated with the values stored in LUTs to compensate for non-uniformity and aging. The measurements can be repeated during the display lifetime either by the user or at defined intervals based on display usage.

Figure 6A:
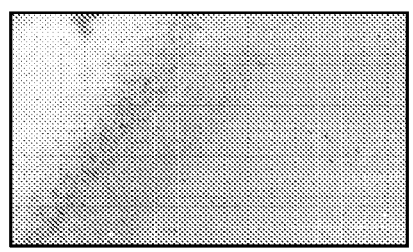
FIG. 6A is an image of an AMOLED panel without compensation.
Figure 6B:
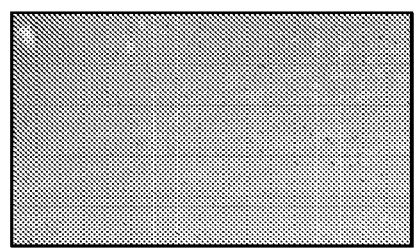
FIG. 6B is an image of an AMOLED panel with in-pixel compensation.
Figure 6C:
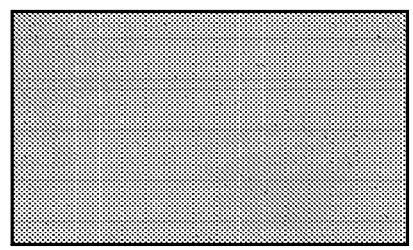
FIG. 6C is an image of an AMOLED panel with extra external calibration.

The solar panel can also be used for initial uniformity calibration of the display. One of the major problems with OLED panels is non-uniformity. Common sources of non-uniformity are the manufacturing process and differential aging during use. While in-pixel compensation can improve the uniformity of a display, the limited compensation level attainable with this technique is not sufficient for some displays, thereby reducing the yield. With the integrated OLED/solar panel, the output current of the solar panel can be used to detect and correct non-uniformities in the display. Specifically, calibrated imaging can be used to determine the luminance of each pixel at various levels. The theory has also been tested on an AMOLED display, and FIG. 6 shows uniformity images of an AMOLED panel (a) without compensation, (b) with in-pixel compensation and (c) with extra external compensation. FIG. 6(c) highlights the effect of external compensation which increases the yield to a significantly higher level (some ripples are due to the interference between camera and display spatial resolution). Here the solar panel was calibrated with an external source first and then the panel was calibrated with the results extracted from the panel.

As can be seen from the foregoing description, the integrated display can be used to provide AMOLED displays with a low ambient light reflectance without employing any extra layers (polarizer), low power consumption with recycled electrical energy, and functionality as an optical based touch screen without an extra touch panel, LED sources or sensors. Moreover, the output of the solar panel can be used to detect and correct the non-uniformity of the OLED panel. By carefully choosing the solar cell and adjusting the semitransparent cathode of the OLED, the performance of this display system can be greatly improved.

While particular implementations and applications of the present disclosure have been illustrated and described, it is to be understood that the present disclosure is not limited to the precise construction and compositions disclosed herein and that various modifications, changes, and variations can be apparent from the foregoing descriptions without departing from the spirit and scope of the invention as defined in the appended claims.

What is claimed is:

1. A method of managing energy in an active matrix OLED display, the method comprising:
   integrating the OLED display with a solar panel located behind the OLED display, the solar panel converting light emitted from the OLED display into electrical energy; and
   storing the electrical energy in electrical energy storage coupled to the solar panel.

2. A method of correcting non-uniformities of an active matrix OLED display, the method comprising:
   integrating the OLED display with a solar panel located behind the OLED display, the solar panel including an array of electrodes on at least one surface of said solar panel for generating output signals corresponding to light emissions from various areas across the OLED display;
   detecting non-uniformities in the OLED display from said output signals; and
   correcting the detected non-uniformities in the OLED display.

3. An active matrix display comprising:
   a transparent front sheet;
   a semi-transparent layer of light emissive devices adjacent the rear side of said front sheet and forming a matrix of display pixels for displaying images for viewing through said front sheet, and
   a solar panel located behind said light emissive devices, said solar panel including an array of electrodes on at least one surface of said solar panel for generating output signals corresponding to light emissions from various light emissive devices across the matrix of display pixels for use in detecting and correcting non-uniformities in the active matrix display.

4. The active matrix display of claim 3 further comprising:
   a detection circuit for the detecting of the non-uniformities in the active matrix display from said output signals; and
   a correction circuit for the correcting the detected non-uniformities in the active matrix display.

5. The active matrix display of claim 3 in which said semi-transparent layer of light emissive devices includes a substantially transparent anode adjacent said front sheet, a semi-transparent semiconductor stack forming organic light emitting diodes adjacent the rear side of said anode, a semi-transparent cathode adjacent the rear side of said semiconductor stack, a cover glass spaced rearwardly of said cathode and covering said solar panel, and a peripheral sealant bonding said cover glass to said transparent front sheet.

6. The active matrix display of claim 5 in which said peripheral sealant holds said cover glass spaced away from the rear side of said cathode to form an air gap between said cathode and said cover glass.

7. The active matrix display of claim 3 in which said transparent front sheet is a glass substrate for said semi-transparent layer of light emissive devices.

8. The active matrix display of claim 3 in which said solar panel includes laminated N-type and P-type semiconductor materials, and said array of electrodes includes multiple electrode segments located on the front surface of said semiconductor laminate and spaced from each other to allow light from said light emissive devices to impinge on said semiconductor laminate.

9. The active matrix display of claim 8 in which said array of electrodes includes first spaced electrode segments running in a first direction on one surface of said semiconductor laminate, and second spaced electrode segments running in a second direction on the opposite surface of said semiconductor laminate.

10. The active matrix display of claim 3 in which said semi-transparent layer of light emissive devices includes a substantially transparent anode and a semi-transparent cathode.

11. The active matrix display of claim 3 wherein the electrodes on the at least one surface of the solar panel generates the output signals for use in detecting the location of a change in the amount of light impinging on a portion of the front surface of said solar panel due to an object in front of said front sheet reflecting light from said emissive devices back through said front sheet and said emissive devices to said solar panel.

12. The active matrix display of claim 11 further comprising: a touch screen circuit coupled to said solar panel for receiving said output signals from said array of electrodes and for detecting the location of said change in the amount of light with use of said output signals.

13. The active matrix display of claim 3, wherein the solar panel located behind said light emissive devices converts light emitted from said light emissive devices into electrical energy, the active matrix display further comprising electrical energy storage coupled to the solar panel for storing said electrical energy.

14. The active matrix display of claim 3, wherein the solar panel comprises a plurality of solar cell units, each solar cell unit representing one or more pixels or sub-pixels.

15. The active matrix display of claim 14, wherein each solar cell unit is calibrated at different color and brightness levels, and the resulting values are stored in a lookup table for use in the detecting and the correcting the non-uniformities in the active matrix display.

* * * * *